(12) United States Patent
Aoki et al.

(10) Patent No.: US 7,663,886 B2
(45) Date of Patent: Feb. 16, 2010

(54) ELECTRIC CIRCUIT DEVICE AND THE MANUFACTURING METHOD

(75) Inventors: Kazuo Aoki, Anjo (JP); Junji Tsuruoka, Anjo (JP); Seiji Yasui, Nagoya (JP); Yasushi Kabata, Sakai (JP); Shin Soyano, Matsumoto (JP)

(73) Assignees: Aisin AW Co., Ltd., Anjo (JP); Fuji Electric Device Technology Co., Ltd., Tokyo (JP)

( * ) Notice: Subject to any disclaimer, the term of this patent is extended or adjusted under 35 U.S.C. 154(b) by 34 days.

(21) Appl. No.: 12/003,037

(22) Filed: Dec. 19, 2007

(65) Prior Publication Data

US 2008/0158824 A1 Jul. 3, 2008

(51) Int. Cl.
*H05K 7/20* (2006.01)
*H01L 23/02* (2006.01)

(52) U.S. Cl. ............... 361/715; 361/622; 361/790; 361/796; 257/678; 257/687; 257/712

(58) Field of Classification Search .......... 361/622, 361/704, 715, 7, 790, 796
See application file for complete search history.

(56) References Cited

U.S. PATENT DOCUMENTS 5,751,058 A    5/1998   Matsuki
5,920,119 A *  7/1999   Tamba et al. ............... 257/718
6,144,571 A * 11/2000   Sasaki et al. ............... 363/144
6,147,869 A * 11/2000   Furnival .................... 361/719
6,272,015 B1*  8/2001   Mangtani ................... 361/707
6,297,549 B1* 10/2001   Hiyoshi ..................... 257/703
6,521,983 B1*  2/2003   Yoshimatsu et al. ......... 257/678
6,650,559 B1* 11/2003   Okamoto et al. ............ 363/141
6,774,465 B2*  8/2004   Lee et al. ................... 257/671
6,791,170 B1*  9/2004   Fuku et al. ................. 257/678
6,828,600 B2* 12/2004   Lenniger et al. ............ 257/181
6,958,535 B2* 10/2005   Hirano et al. ............... 257/707

FOREIGN PATENT DOCUMENTS

| JP | A 09-121019  | 5/1997  |
| JP | A 2002-164500 | 6/2002  |
| JP | A 2003-243609 | 8/2003  |
| JP | A 2004-228403 | 8/2004  |
| JP | A 2006-287101 | 10/2006 |

* cited by examiner

*Primary Examiner*—Boris L Chervinsky
(74) *Attorney, Agent, or Firm*—Oliff & Berridge, PLC (57) ABSTRACT

An electronic circuit device includes a lower-side substrate formed with a main circuit; an upper-side substrate formed with a drive control circuit that drivingly controls the main circuit; a support body positionally fixed above the lower-side substrate with resin in a hardened state; and a case having a peripheral portion with an outer surface that has at least a portion of an external lead-out terminal of the drive control circuit and the main circuit thereon, and a substrate storage space that accommodates the lower-side substrate on a side inward from the peripheral portion.

18 Claims, 9 Drawing Sheets

ELECTRIC CIRCUIT DEVICE AND THE MANUFACTURING METHOD

INCORPORATION BY REFERENCE

The disclosure of Japanese Patent Application No. 2006-351622 filed on Dec. 27, 2006 including the specification, drawings and abstract is incorporated herein by reference in its entirety.

BACKGROUND

The present application relates to an electronic circuit device and a manufacturing method for such an electronic circuit device.

There exists an electronic circuit device that is an inverter module for drivingly controlling an electric motor. In the inverter module, a power circuit mounted with a power semiconductor element serves as the main circuit. A drive control circuit is also provided for the purpose of executing a drive control with respect to the main circuit.

There exists an inverter module that includes the main circuit and the drive control circuit that vertically overlap a substrate formed with the main circuit and a substrate formed with the drive control circuit, thus making the module more compact. Japanese Patent Application Publication No. JP-A-2002-164500 aims to resolve problems involved in disposing this type of substrate in an overlapping manner. Namely, according to Japanese Patent Application Publication No. JP-A-2002-164500, by giving a drive control circuit print board on the upper-side substrate a C shape, an inverter module with better ease of assembly and higher reliability can be achieved at a lower cost.

In the inverter module described in Japanese Patent Application Publication No. JP-A-2002-164500, an insulated substrate mounted with a power semiconductor element and a case with at least a portion of an external lead-out terminal on a peripheral portion thereof are positionally fixed on a metal base plate for heat radiation. A drive control substrate is further positionally fixed there above.

A peripheral portion of the power semiconductor is filled with a gel-like substance such as silicon gel. The purpose of this type of gel is mainly to fill the peripheral portion of the lower-side substrate and a clearance between the lower-side substrate and the upper-side substrate.

Meanwhile, the upper-side substrate avoids the lower-side substrate by using a support body on a metal base plate. In the examples disclosed in Japanese Patent Application Publication No. JP-A-2002-164500, a relay terminal block in a first embodiment (FIG. 1 in Japanese Patent Application Publication No. JP-A-2002-164500), a support block in a second embodiment (FIG. 2(b) in Japanese Patent Application Publication No. JP-A-2002-164500), and a support block in a third embodiment (FIG. 3(b) in Japanese Patent Application Publication No. JP-A-2002-164500) are positionally fixed on the upper-side substrate.

SUMMARY

As is also apparent from such examples, a dedicated space for a support body is required in order to positionally fix the upper-side substrate.

Figure 13:
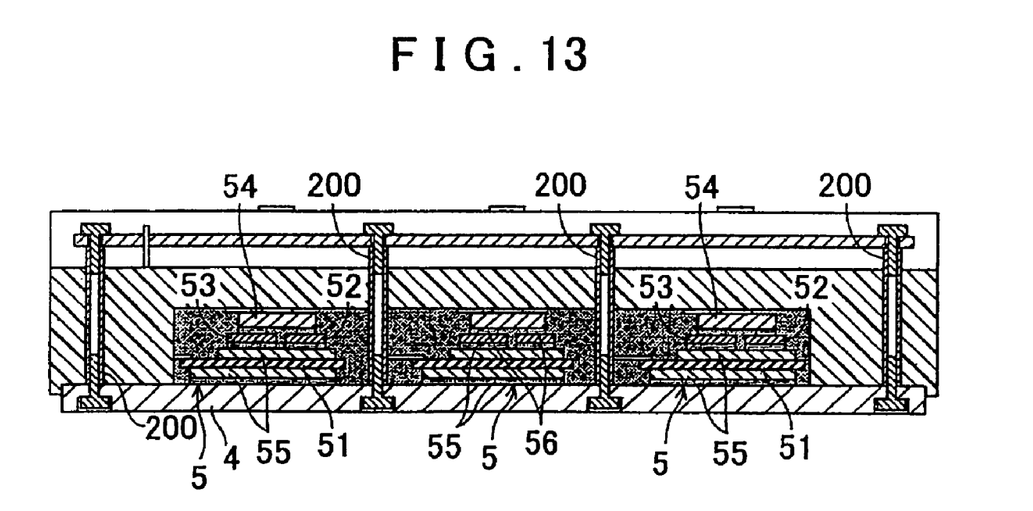
FIG. 13 is an explanatory view of a conventional configuration that employs a lower-side substrate formed equipped with an insulated substrate.

As shown in FIG. 13, the main circuit has a configuration as follows. On a metal base plate 4, both front and back surfaces of an insulated substrate 51 are provided with a copper foil 55, and the copper foil 55 on the lower side is fixed to the metal base plate 4 by a solder 56. In addition, the copper foil 55 on the upper side is provided with power semiconductor elements 52 and 53 via the solder 56, and a heat spreader 54 is provided on the upper side of the power semiconductor elements 52 and 53. In such a configuration, the lower-side substrate 5 formed with the main circuit has a relatively tall height. Moreover, when such a lower-side substrate 5 is employed and an upper-side substrate 6 is positionally fixed based on a conventional configuration, a support body 200 as shown in the same FIG. 13 becomes a long member.

According to the configuration disclosed in Japanese Patent Application Publication No. JP-A-2002-164500, a dedicated space is required for a support body to positionally fix the upper-side substrate at a position in the height direction of the lower-side substrate. The dedicated space is different from the exclusive space for the lower-side substrate, and results in inefficient use of space. As a consequence, the inverter module has poor volumetric efficiency and an increased size.

The support body is a long body that extends from a position in the height direction of the lower-side substrate toward a lower surface of the upper-side substrate. Therefore, it is difficult to secure the vibration resistance characteristic of the support body with regard to the upper-side substrate.

As shown in FIG. 13, the adoption of a configuration that positions and fixes the support body using the metal base plate creates a need for screws and screw flange holes in a number corresponding to the number of support bodies, which increases costs.

The present invention thus provides, among other things, art capable of achieving a compact and low-cost electronic circuit device that includes a pair of substrates provided one above the other, and formed with a surrounding area of a lower-side substrate filled with a filling material. The electronic circuit device is also capable of achieving high reliability and high vibration resistance with regard to a vibration resistance characteristic of an upper-side substrate.

According to an exemplary aspect, an electronic circuit device includes a lower-side substrate formed with a main circuit; an upper-side substrate formed with a drive control circuit that drivingly controls the main circuit; a support body positionally fixed above the lower-side substrate with resin in a hardened state; and a case having a peripheral portion with an outer surface that has at least a portion of an external lead-out terminal of the drive control circuit and the main circuit thereon, and a substrate storage space that accommodates the lower-side substrate on a side inward from the peripheral portion. The lower-side substrate is accommodated inside the substrate storage space in an arrangement where the upper-side substrate is positioned over at least a portion of the lower-side substrate. A space over the lower-side substrate is filled with a filling material that is formed from a resin. The upper-side substrate is supported and fixed by the support body.

According to an exemplary aspect, a manufacturing method for an electronic circuit device including a lower-side substrate formed with a main circuit; an upper-side substrate formed with a drive control circuit that drivingly controls the main circuit; and a case having a peripheral portion with an outer surface that has at least a portion of an external lead-out terminal of the drive control circuit and the main circuit thereon, and a substrate storage space that accommodates the lower-side substrate on a side inward from the peripheral portion, wherein the lower-side substrate is accommodated inside the substrate storage space in an arrangement where the upper-side substrate is positioned over at least a portion of the lower-side substrate, and at least a space over the lower-side substrate is filled with a filling material, includes the steps of: pouring a resin serving as the filling material between the lower-side substrate and a support body in a support body positioned state where the support body that supports the upper-side substrate is positioned over the lower-side substrate, which is positioned within the substrate storage space; hardening the poured resin and positionally fixing the support body over the lower-side substrate; and fixing the upper-side substrate on the positionally fixed support body.

BRIEF DESCRIPTION OF THE DRAWINGS

Various embodiments of the invention will be described with reference to the drawings, wherein.

DETAILED DESCRIPTION OF EMBODIMENTS

Embodiments of the present application are described below based on the accompanying drawings and using an example of an inverter module 1 as an electronic circuit device.

Figure 1:
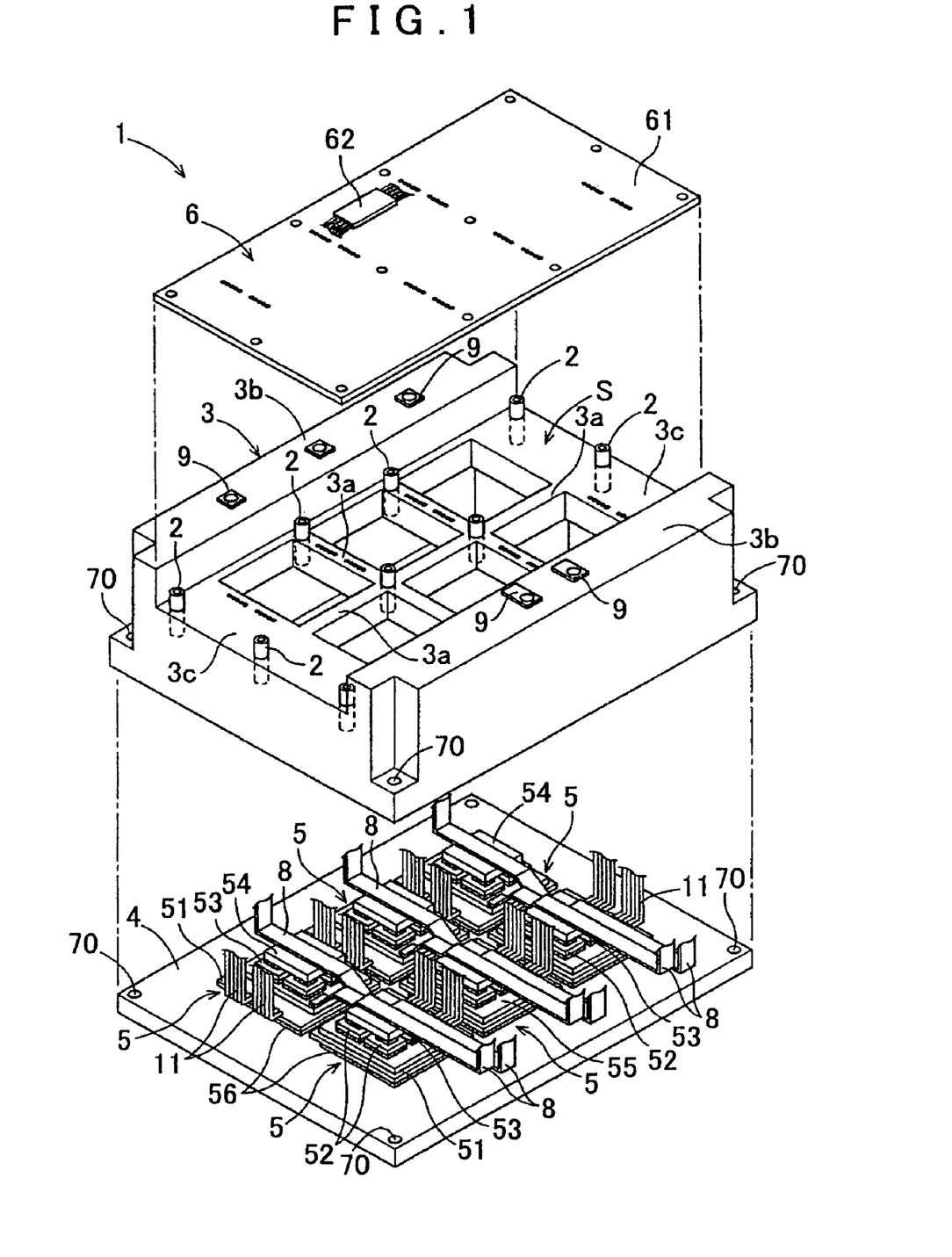
FIG. 1 is an exploded perspective view of an inverter module.
Figure 2:
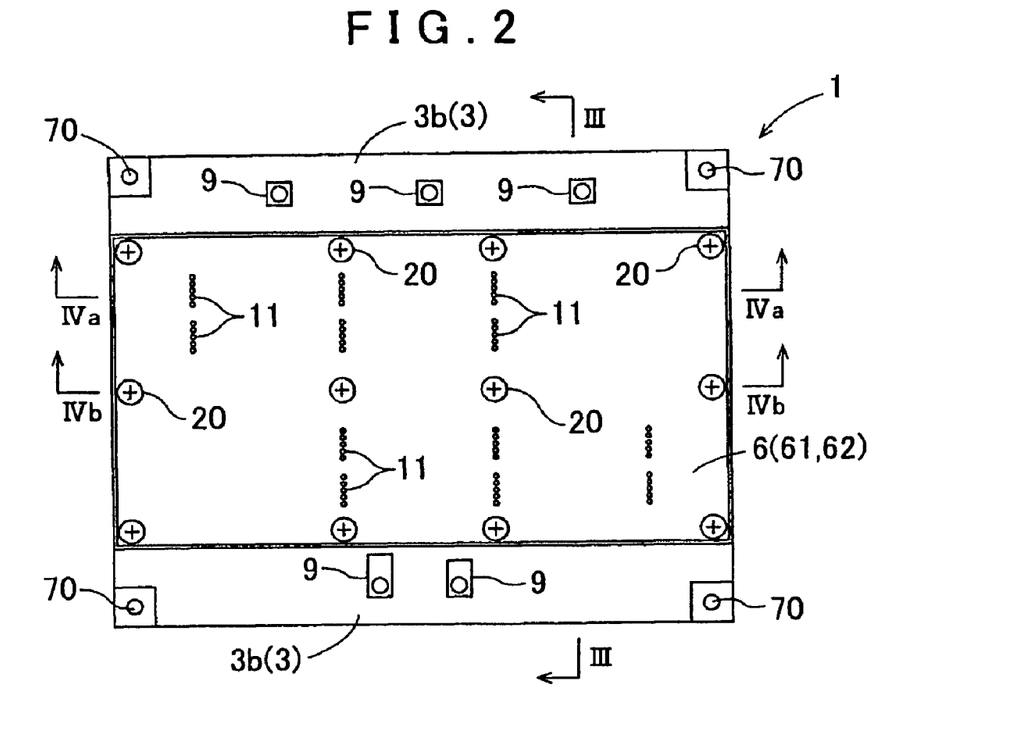
FIG. 2 is a view showing a place configuration of the inverter module.
Figure 3:
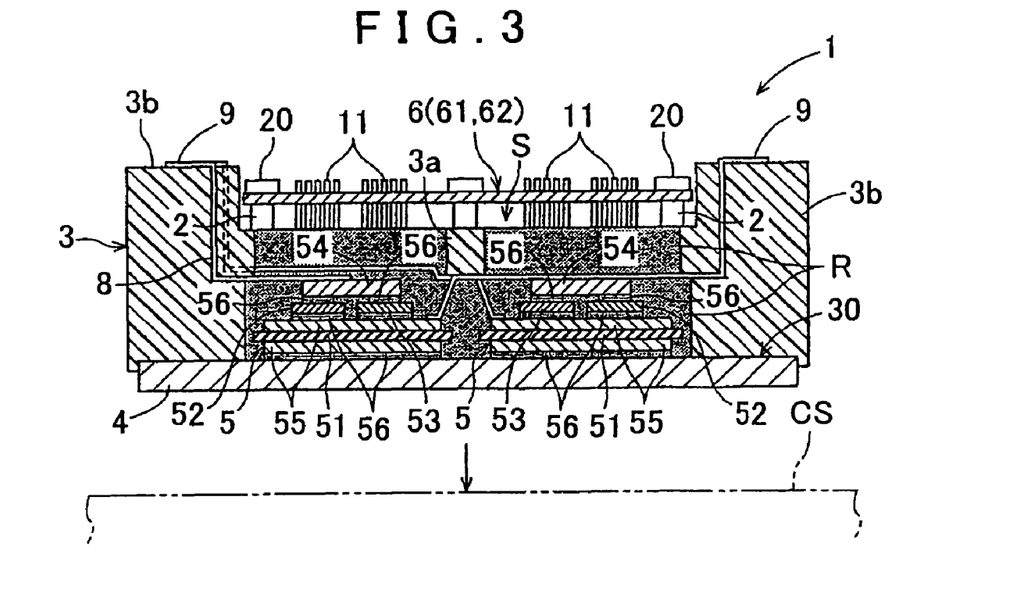
FIG. 3 is a view showing a cross section taken along a line III-III in FIG. 2.
Figure 4A:
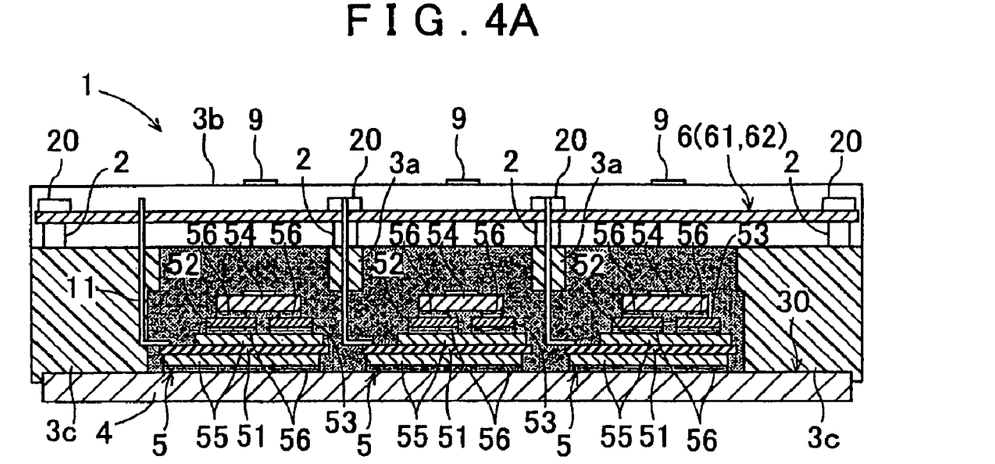
FIG. 4A shows a cross section taken along a line IV(a)-IV(a) and FIG. 4B shows a cross section taken along a line IV(b)-IV(b) in FIG. 2.
Figure 4B:
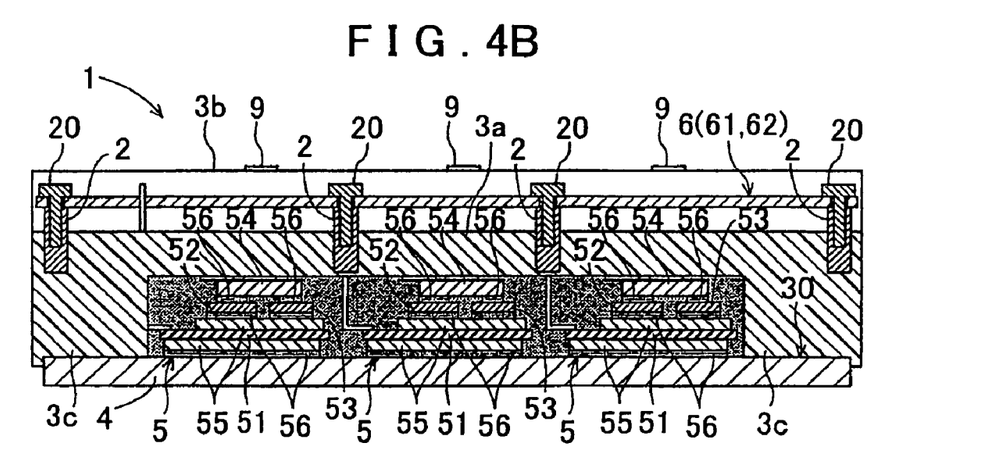

FIG. 1 is an exploded perspective view of the inverter module 1, and FIG. 2 is a plane view thereof. FIG. 3 shows a cross section taken along a line III-III in FIG. 2. FIG. 4A shows a cross section taken along a line IV(a)-IV(a), while FIG. 4B shows a cross section taken along a line IV(b)-IV(b) in FIG. 2. Here, FIG. 4A is a view showing a cross-sectional structure at a position from which a support frame 3a has been removed, which is integrally formed with a resin case 3 that is a characteristic structure of the present application and positions a support body 2. FIG. 4B is a view showing a cross-sectional structure of a vertically center region of FIG. 2 that is provided with the support frame 3a.

As evident in FIGS. 1 to 4B, the inverter module 1 includes a metal base plate 4, a resin case 3 positionally fixed thereupon, a plurality of lower-side substrates 5 that are juxtaposed, and a single upper-side substrate 6 that is supported and fixed farther upward than the lower-side substrate 5.

The metal base plate 4 fulfills the role of a support frame in the inverter module 1, as well as the role of a heat sink for a cooling system CS (see FIG. 3) disposed on a bottom side of the metal base plate 4. The metal base plate 4 is a rectangular copper plate that is slightly smaller than the outer contour of the resin case 3 shown in FIG. 1 when viewed top wise.

The resin case 3 has a rectangle shape when viewed top wise, as apparent from FIGS. 1 and 2. As FIGS. 3 to 4B also clearly show, the resin case 3 includes a pair of transverse peripheral portions 3b that is positioned with respect to the vertical direction in FIG. 2, and a pair of connecting portions 3c that respectively connects the pair of transverse peripheral portions 3b at right and left ends thereof.

The transverse peripheral portion 3b has vertical-direction cross-sectional shape that is generally rectangular, as shown in FIG. 3, and a lower portion area thereof is provided with a bonded portion 30 attached with the metal base plate 4. Also, at a predetermined position in the lateral direction in FIG. 2, a lead frame 8 is incorporated through integral molding, and a structure is employed that exposes an external lead-out terminal 9 on an upper-side outer surface of the resin case 3. In the example shown, the external lead-out terminal 9 is provided at three locations in the crosswise direction of the transverse peripheral portion 3b positioned on the upper side in FIG. 2, while the external lead-out terminal 9 is provided at two locations in the crosswise direction of the transverse peripheral portion 3b positioned on the lower side in FIG. 2.

According to FIG. 2, end portions at the four corners forming a rectangle due to the pair of transverse peripheral portions 3b are formed, for example, with connecting holes 70 for connection with the cooling system CS.

The same structure as the transverse peripheral portion 3b is employed for the connecting portion 3c on a metal base plate side thereof, as shown in FIG. 4, and the bonded portion 30 attached to the metal base plate 4 is provided. Meanwhile, the height of the upper-side outer surface of the connecting portion 3c is set one step lower than the height of the upper-side outer surface of the transverse peripheral portion 3b. The connecting portion 3c is also structured so as to enable placement of the upper-side substrate 6.

Figure 5:
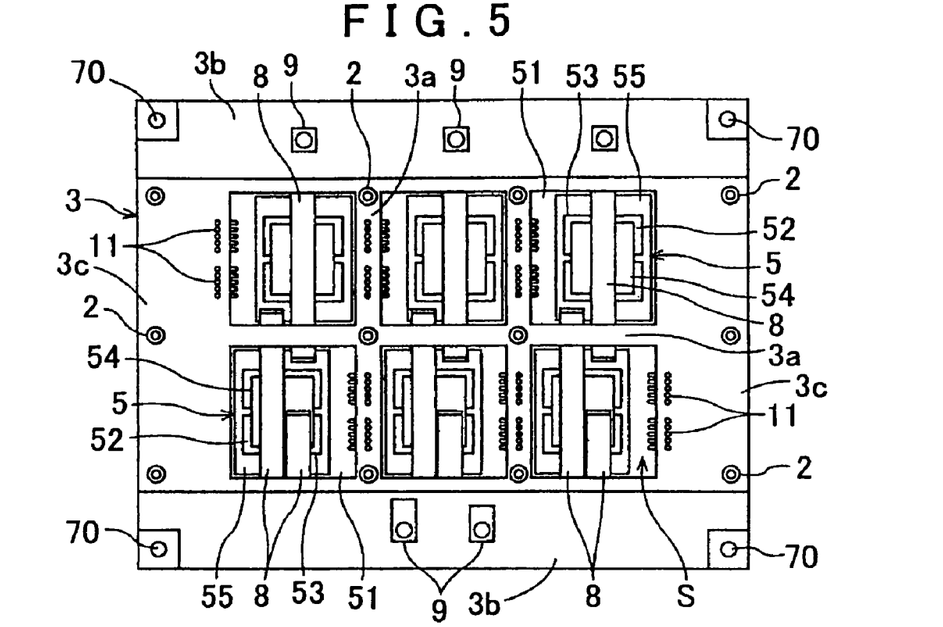
FIG. 5 is a plane view of a state where a lower-side substrate and a resin case are positionally fixed to a metal base plate.

FIG. 5 shows a state where the lower side-substrate 5 and the resin case 3 are positionally fixed on the metal base plate 4, but before the upper-side substrate 6 is attached. It is clear that a substrate storage space S is formed on an inner side in a state surrounded by the pair of transverse peripheral portions 3b and the pair of connecting portions 3c.

The resin case 3 further includes a support frame 3a that bridges the pair of transverse peripheral portions 3b and the pair of connecting portions 3c in a state that criss-crosses the substrate storage space S in a cross configuration. The support frame 3a, as shown in FIG. 4A, is a frame body formed with a cross-sectional rectangular shape. Also apparent from FIG. 5 is that from a plane view, the support frame 3a is provided so as to evenly divide the substrate storage space S at one location in a vertically center region thereof and evenly divide it at two locations in the lateral direction. In addition, as FIG. 4 clearly shows, a position on the upper-side outer surface of the support frame 3a coincides with a position of the upper-side outer surface of the connecting portion 3c. Meanwhile, as FIG. 3 clearly shows, the lower-side surface of the support frame 3a is set at a position that contacts the lead frame 8 from the upper side.

Furthermore, as apparent in FIG. 4B, positionally fixed on the support frame 3a at a predetermined region is the support body 2 (more specifically, a boss member made of metal and provided with a bolt hole on an inner portion) for positionally fixing the upper-side substrate 6. Moreover, a plurality of lead pins 11 are positionally fixed at predetermined locations on the support frame 3a.

As shown in the figures, a positioning portion for the lead pin 11 in the support frame 3a is provided adjacent to a positioning portion for the support body 2 in the support frame 3a.

The structural material of the resin case 3 more specifically employs a resin such as poly butylene terephthalate (PBT) or poly phenylene sulfide (PPS).

Figure 6:
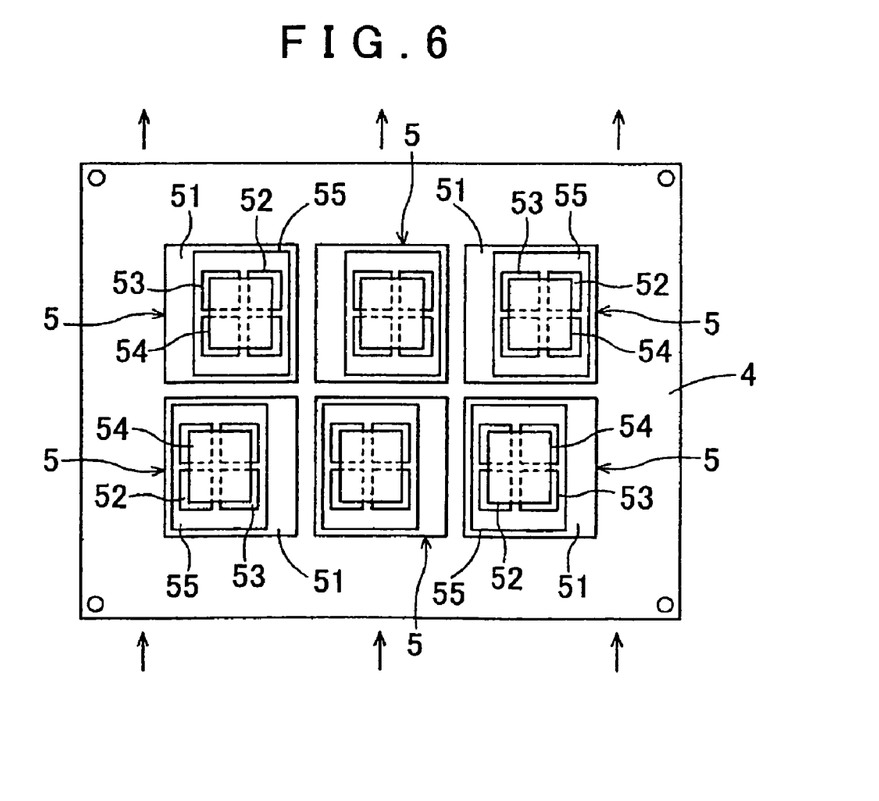
FIG. 6 is a view showing a layout configuration of respective lower-side substrates on the metal base plate.

The lower-side substrate 5 is also positionally fixed on the metal base plate 4. The lower-side substrate 5 is used for the purpose of forming a power circuit serving as a main circuit in the inverter module 1. In the present example, as FIG. 6 shows, a structure is adopted that includes a top row and a bottom row with three individual lower-side substrates 5 each. The respective substrates 5 each include a pair of a freewheeling diode (FWD) element 52 and an insulated gate bipolar transistor (IGBT) element 53, which are power semiconductor elements, on a single insulated substrate 51. The respective substrates 5 are further structured to include a single heat spreader 54.

Here, the arrangement of the six lower-side substrates 5 employs a positional relationship in which the six substrates are symmetric with respect to a point when viewed as a whole. In the same figure, arrows indicate a flow direction of a refrigerant in the cooling system CS.

Also, the support frame 3a described earlier is positioned such that a portion thereof runs above and between different lower-side substrates 5.

In addition, the respective lower-side substrates 5, as shown in FIG. 3, are structured as follows. A copper foil 55 is provided on both the front and back surfaces of the insulated substrate 51. The copper foil 55 on the lower side is attached to the metal base plate 4 through a solder 56, while power semiconductor elements (i.e., the FWD element 52 and the IGBT element 53, which are power semiconductor elements) are attached on top of the copper foil 55 on the upper side through the solder 56. The heat spreader 54 is further attached to the upper side of the power semiconductor elements 52 and 53 through the solder 56.

The respective lead frames 8 employ a structure in which predetermined locations for the output of the lower-side substrates 5 are connected. Furthermore, the lead pins 11 also employ a structure in which predetermined locations of the circuit formed on the insulated substrate 51 are connected.

As shown in FIGS. 3 and 4, a resin R (more specifically, an epoxy resin) acting as a filling material fills up the substrate storage space S formed by the metal base plate 4 and the resin case 3 up to a position on the upper-side outer surface of the connecting portion 3c of the resin case 3. The resin R is hardened and ultimately integrated with the resin case 3.

The upper-side substrate 6 forms a drive control circuit for drivingly controlling the power circuit. The drive control circuit is a circuit mounted with a print circuit board 61 and a circuit component 62. The drive control circuit and the power circuit are connected via the lead pin 11.

Positional fixing of the upper-side substrate 6 is achieved by the support body 2 (more specifically, a boss member made of metal and provided with a bolt hole on an inner portion) described earlier.

A portion of the support body 2 is positionally fixed in the vicinity of an end portion of the connecting portion 3c of the resin case 3. As also previously indicated, a remaining portion is positionally fixed by the support frame 3a that is integrally provided with the resin case 3.

FIG. 5 also clearly shows that, in the present example, a total of twelve support bodies 2 are evenly dispersed in the resin case 3 and arranged in rows of four in the lateral direction and columns of three in the vertical direction. Using these support bodies 2, the upper-side substrate 6 is bolted to the support bodies 2 such that the upper-side substrate 6 is positionally fixed.

The above description concerned the configuration of the inverter module 1. A manufacturing process for the inverter module 1 will be described below based on FIGS. 7A-7C.

Preparation Process

Manufacturing the inverter module 1 requires the resin case 3 with a shape configuration unique to the present application. The resin case 3 should be prepared in which the support frame 3a described earlier is provided, a metal boss member serving as the support body 2 is provided upright at a predetermined location, and the lead frame 8 and the lead pin 11 are embedded in the resin case 3.

Lower-Side Substrate Formation Process

Respective lower-side substrates 5 are arranged and formed at predetermined locations on the metal base plate 4 prepared separately.

Resin Case Bonding Process

Following the arrangement and formation of the lower-side substrate 5, the resin case 3 prepared in the preparation process is bonded and fixed on the metal base plate 4.

Figure 7A:
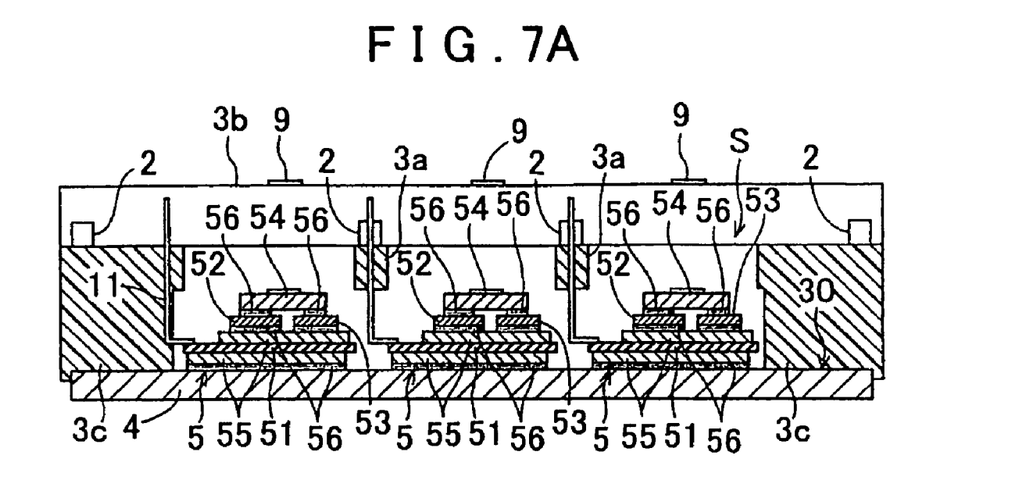
FIGS. 7A-7C show explanatory views of a manufacturing process for the inverter module.

A plane view of this state is shown in FIG. 5, and a cross-sectional view is shown in FIG. 7A.

In such a state, no resin has been poured in yet. However, the support body 2 (the metal boss member) is securely positioned by the resin case 3 (including the support frame 3a), and this state is called a support body positioned state in the present application. Furthermore, as apparent from FIG. 3, the lead frame 8 is held pressed downward by the bottom surface of the support frame 3a. In this state, predetermined locations on the lead frame 8 and the lead pin 11 are connected to predetermined regions of the circuit formed on the lower-side substrate 5.

Resin Filling Process

Figure 7B:
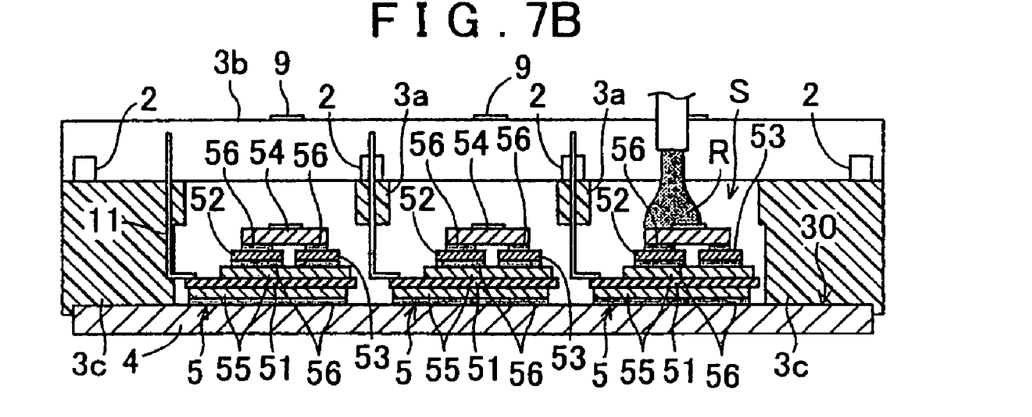

As shown in FIG. 7B, the resin R serving as the filling material is poured from a portion of the substrate storage space S that opens to the upper side. According to the present application, a relatively large space is formed on the lower side of the support frame 3a, so it is possible for the resin R to evenly blanket all respective portions during such a pouring operation.

Support Body Fixing Process

Figure 7C:
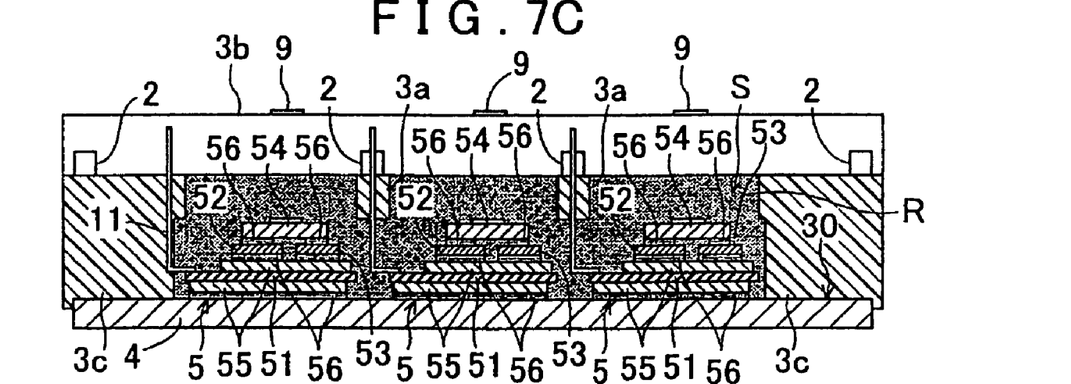

The poured resin R hardens, as shown in FIG. 7C, whereby the support body 2 positioned by the support frame 3a is firmly and positionally fixed above the lower-side substrate 5.

Upper-Side Substrate Fixing Process

The print circuit board forming the drive control circuit, i.e., the upper-side substrate 6, is fixed by a bolt 20 to the positionally fixed support body 2 (the metal boss member), as shown in FIGS. 4A and 4B. In addition, connecting the lead pin 11 to a predetermined location of the drive control circuit completes a connection between the lower-side substrate 5 and the upper-side substrate 6.

Manufacturing of the inverter module 1 according to the present application can be completed as described above.

Other Embodiments (1) The description of the above embodiment pertained to a structure in which both the lower-side substrate 5 and the upper-side substrate 6 are accommodated inside the substrate storage space S formed on an inner side of the resin case 3. However, depending on the specifications, there may be cases necessitating a large distance between the lower-side substrate 5 and the upper-side substrate 6.

Figure 8:
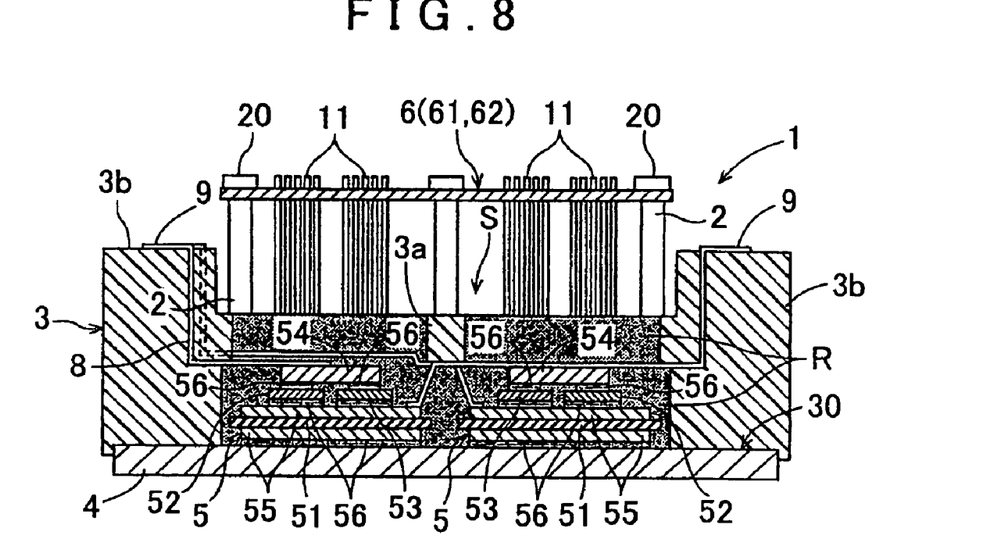
FIG. 8 is a view showing another embodiment using a long support body.

An example shown in FIG. 8 is a structural example given to meet such specifications, and the support body 2 is given a relatively long length. According to the present application, even such a configuration is fully capable of achieving a vibration resistance characteristic on par with conventional levels.

Figure 9:
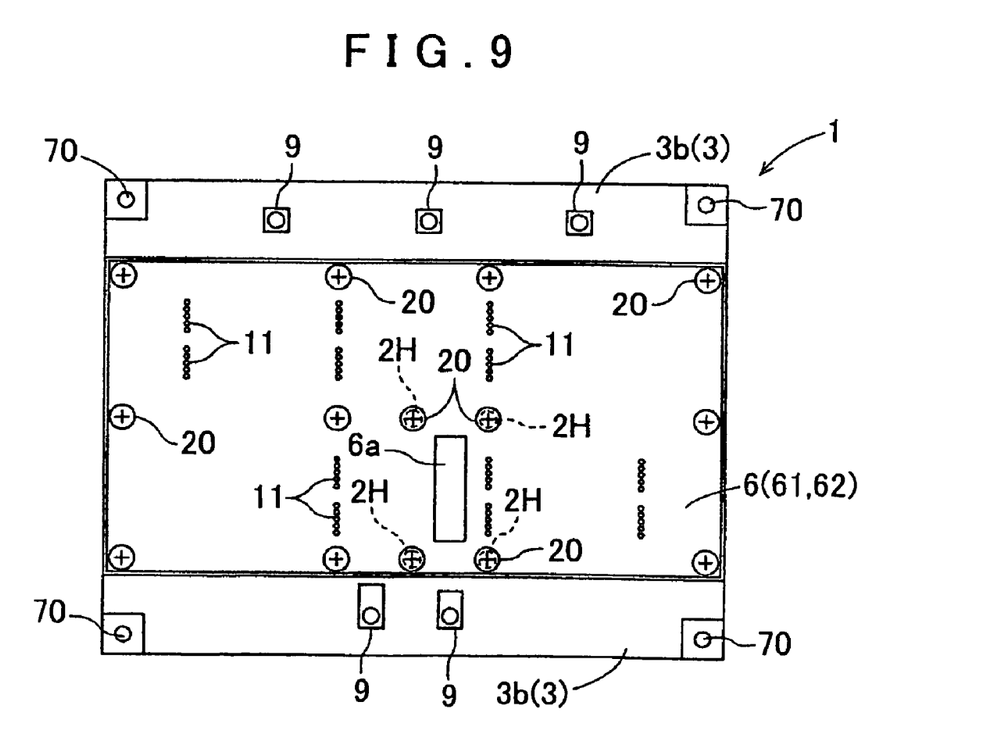
FIG. 9 is a view showing yet another embodiment where the upper-side substrate is equipped with a weight.

(2) The description of the above embodiment pertaining to the upper-side substrate 6 gives an example in which support bodies are evenly dispersed and arranged at twelve locations so as to positionally fix and support the upper-side substrate 6 when a load is evenly applied to respective regions of the substrate. However, according to the present application, there is a high degree of freedom regarding the placement of the support body 2. Therefore, the present invention is also capable of adapting to cases where a weight is placed on a portion of the upper-side substrate 6 and such a region is designated as a weight placement portion 6a. FIG. 9 gives such an example, and shows a weight (such as a heavy condenser) disposed on the upper surface of the upper-side substrate. This example adapts to the presence of a weight by using and bolting the support body 2 provided on the lower side and centered in the left-right and up-down directions in the figure shown. A support body provided in order to bear the load of such a weight is called a weight location support body 2H in the present application. In the figure, the weight location support body 2H is positioned on the lower side of the bolt 20.

(3) The above-described embodiments have structures provided with a support frame 3a that is integrated with the resin case 3 and used for positioning the support body 2. The support body 2 is supported by the support frame 3a in a pre-resin-R-filled state.

However, the present application uses the hardened resin R as a filling material. Therefore, in a state where the resin R has hardened, even without the support frame 3a the support body 2 is positionally fixable by the hardened resin R. Hence, instead of providing the support frame 3a in the resin case 3, a position supporting mechanism PS may be provided that separately positions the support body 2 at a position upward of the lower-side substrate 5 in the pre-resin-R-filled state. The position supporting mechanism PS may then be used to positionally hold the support body 2 until pouring of the resin. After the resin R hardens, holding by the position supporting mechanism PS can be removed. This manufacturing process is illustrated in FIGS. 10A to 12.

Figure 10A:
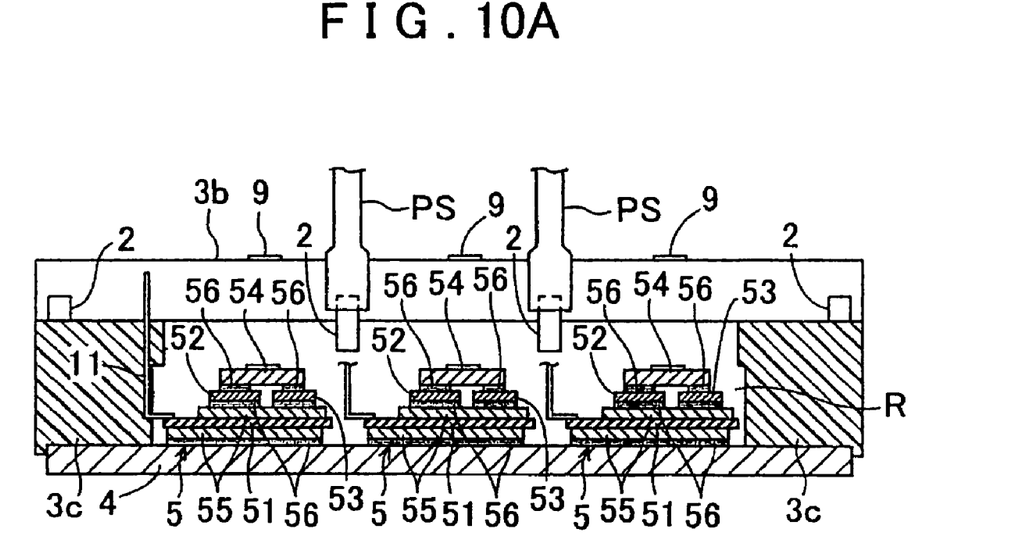
FIGS. 10A and 10B show views of still yet another embodiment where the support body is positionally supported by a position supporting mechanism.
Figure 10B:
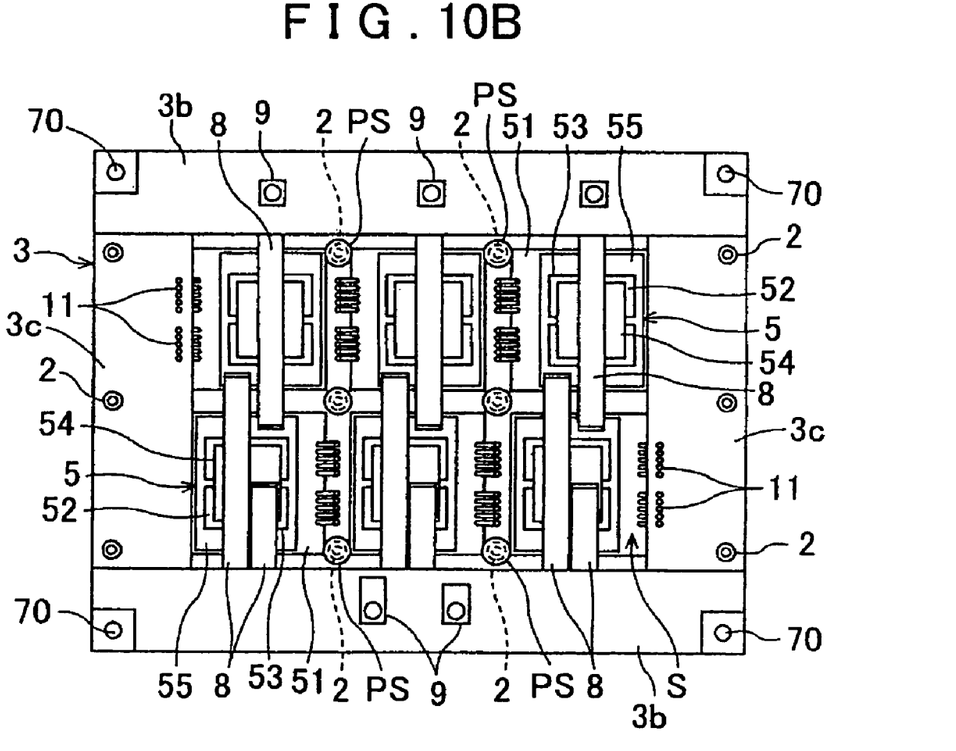
Figure 11A:
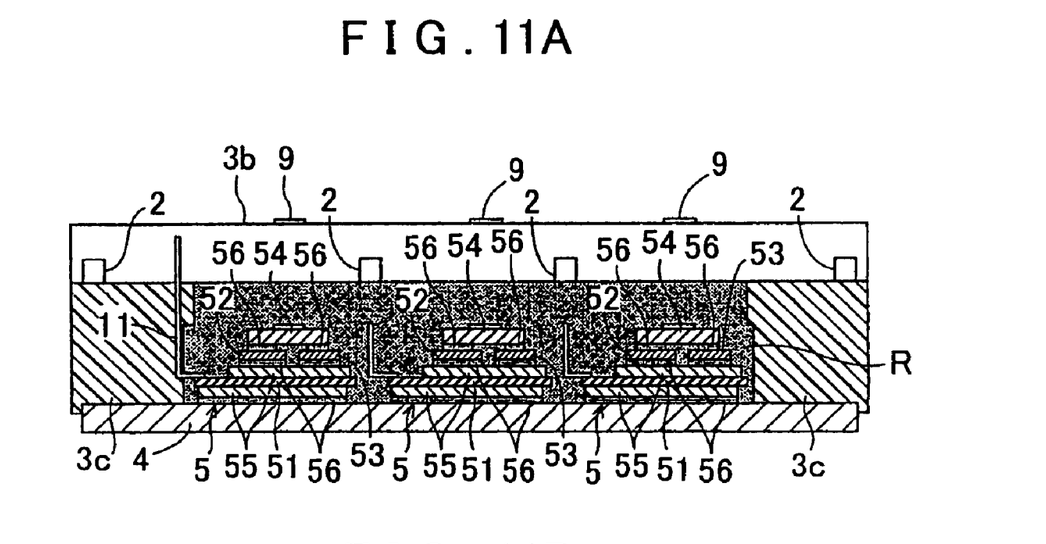
FIGS. 11A and 11B show explanatory views of a process continued from FIG. 10 for the embodiment where the support body is positionally supported by the position supporting mechanism.
Figure 11B:
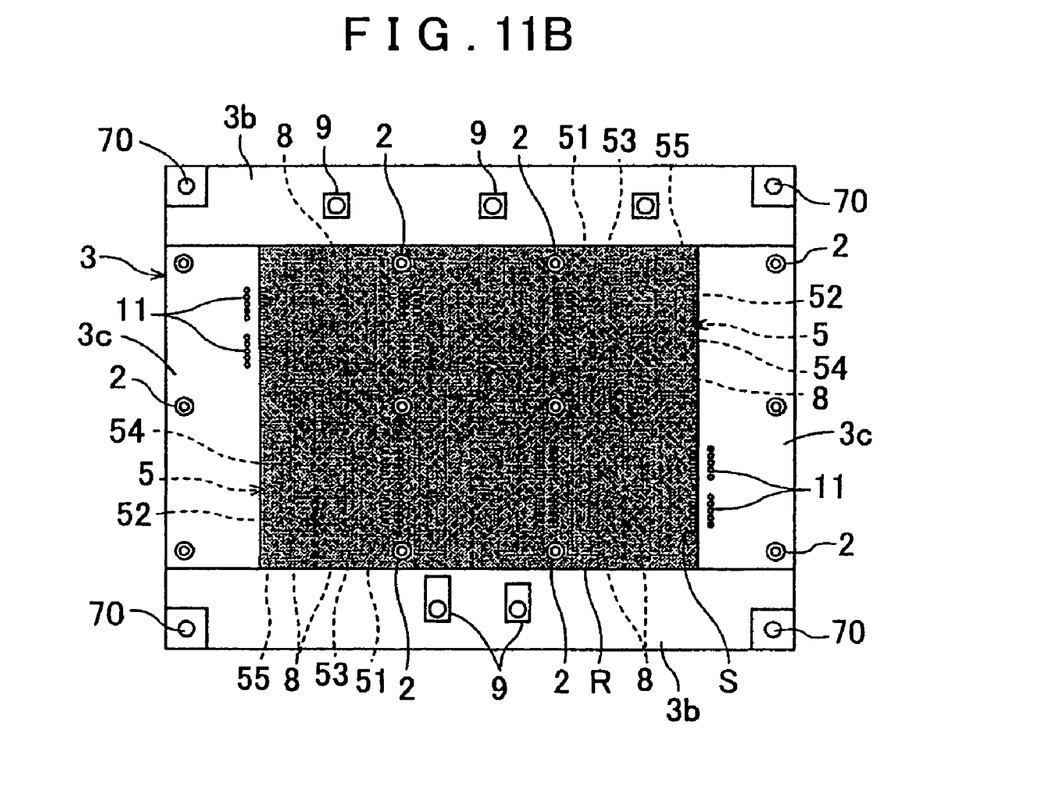
Figure 12:
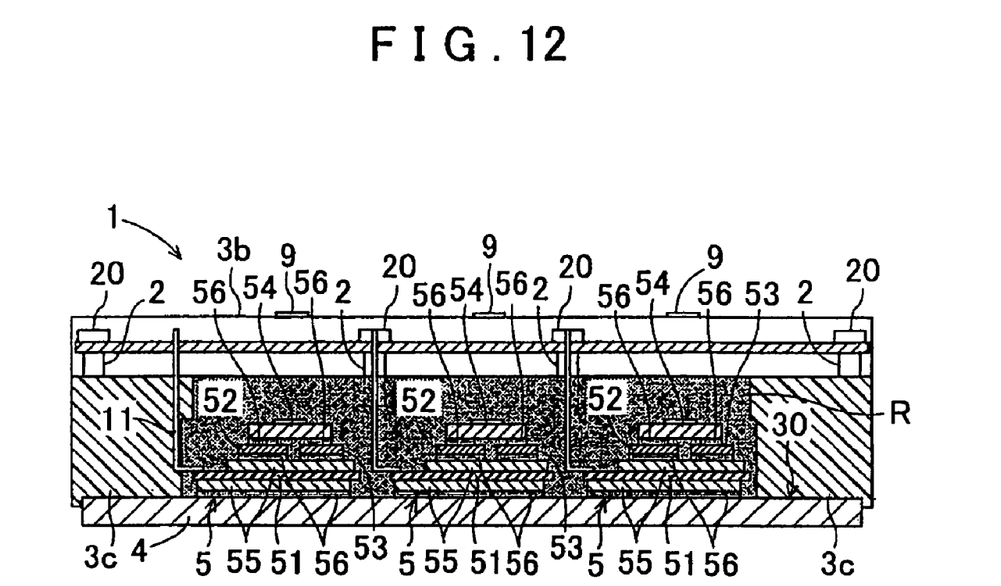
FIG. 12 is an explanatory view of a process continued from FIG. 11 for the embodiment where the support body is positionally supported by the position supporting mechanism.

FIGS. 10A and 10B show a state in which the support body 2 (the metal boss member) and the lead pin 11 are positionally held by the position supporting mechanism PS, and FIGS. 11A and 11B show the resin filling process. FIG. 12 shows a state in which the upper-side substrate 6 is fixed. With such a method, the upper-side substrate 6 can still be positioned and supported well.

(4) The above embodiments illustrate a structure in which the support body is used as a boss and fixed with a bolt in order to fix the upper-side substrate to the support body. However, any structure may be employed as a structure to fix the upper-side substrate.

(5) The above embodiments also illustrate a structure in which the upper-side substrate is disposed above the entire surface of the lower-side substrate. However, as indicated in Japanese Patent Application Publication No. JP-A-2002-164500, a structure may be employed where the upper-side substrate is given a C shape and the substrates only partially overlap vertically.

(6) In the above embodiments, examples are shown where the resin case is PBT or PPS, and epoxy resin is used as a hardening resin for filling. However, acrylic resin or silicon resin may be used in the resin combination of the resin case and the hardening resin for filling.

It is possible to obtain art capable of achieving a compact and low-cost electronic circuit device, similar to an inverter module, that includes a pair of substrates provided one above the other, and formed with a surrounding area of a lower-side substrate filled with a filling material, as well as capable of achieving high reliability and high vibration resistance with regard to a vibration resistance characteristic of an upper-side substrate.

According to an exemplary aspect, the lower-side substrate is a substrate that is positioned on the lower side in such a state that a semiconductor element or the like forming a main circuit is mounted so as to form a predetermined circuit. Meanwhile, the upper-side substrate is a substrate positioned on the upper side of the lower-side substrate in such a state that a circuit component forming a drive control circuit is mounted so as to form a predetermined circuit.

According to such an electronic circuit device, resin is adopted in place of the gel that has been heretofore employed as a filling material. With the resin in a hardened state, the support body is positionally fixed at a position over the lower-side substrate. The upper-side substrate is then secured to the support body, whereby the upper-side substrate is supported and fixed.

Thus, according to this structure, the support body for supporting and fixing the upper-side substrate is positionally fixed over the lower-side substrate. Therefore, it is not necessary to secure a space for the support body at a height position of the lower-side substrate, thus contributing to making the device more compact. Furthermore, if a plurality of the lower-side substrates is provided, a distance between the substrates can be made sufficiently small.

Meanwhile, the support body has a robust structure due to its positional fixing by the resin in a hardened state. Furthermore, the length of the support body need only extend from a position at least higher than the lower-side substrate to a bottom face of the upper-side substrate. Therefore, a shorter support body can be used than that for a conventional structure and the support body is capable of securing a vibration resistance characteristic. But depending on the specifications, there are cases where a longer distance than that conventionally used is needed between the lower-side substrate and the upper-side substrate. However, the support body is positioned between both substrates, and is thus adaptable to such specifications while still securing the vibration resistance characteristic for such specifications.

Furthermore, since resin is adopted as the filling material, using a resin case as the case provided with the external lead-out terminal and the substrate storage space on an inner side enables excellent adaptation and integration between the case and the resin serving as the filling material. Therefore, the positional fixing of the support body, and by extension, the upper-side substrate, can be reliably achieved, in addition to avoiding problems such as cracks in the solder provided on the lower-side substrate.

According to an exemplary aspect, the case itself has a unique structure. Namely, the case is structured having at least a peripheral portion with at least a portion of the external lead-out terminal of the driver control circuit and the main circuit thereon, and having the substrate storage portion (which in reality is filled with the resin acting as the filling material as previously explained) that accommodates the lower-side substrate on an inner portion of the peripheral portion. The case is also provided with the support frame bridging the substrate storage space. The shape of the support frame may be any suitable shape, such as a bar shape or cross configuration. In addition, the support frame may be integrated by die forming at the same time as formation of the case, or the support frame may be prepared using material separate from the case and then ultimately integrated with the case.

The support frame can be used to position the support body, which is a main part of the present application. In other words, according to the present application, the resin in a hardened state ultimately positionally fixes the support body; however, a structure is possible in which the support body is positioned by the support frame from the case side in a state prior to pouring of the resin that will serve as the filling material. As a consequence, positioning of the support body previously described in the first aspect can be easily performed.

Furthermore, according to such a structure, the case, the support frame, the support body, and the resin serving as the filling material are all ultimately integrated. Therefore, an electronic circuit device with excellent robustness and high reliability can be achieved. In particular, integration is preferred if the case is made of resin.

According to an exemplary aspect, to manufacture the electronic circuit device with the above-described structure, a support frame bridging the substrate storage space may be provided integrated with the case, and the support body positioned state is achieved by using the support frame to position the support frame in a lower-side substrate storage state where the lower-side substrate is accommodated within the substrate storage space.

If the support frame is provided integrated with the case as described above, then the space over and between the lower-side substrates is used. If a plurality of the lower-side substrates is provided, then a clearance is normally provided to some extent between the substrates, and a component such as a power semiconductor element is often disposed on an upper portion thereof. Hence, by using such a space as a space for disposing the support frame, the electronic circuit device can be made robust and compact. Moreover, according to the present application, the lower side of the support frame is filled with the resin. However, positioning the support frame over the resin in a hardened state makes it possible to press the resin serving as the filling material from the upper side, and also press the solder provided on the lower-side substrate. As a consequence, issues such as solder cracks that were a problem in the related art can be reduced.

According to an exemplary aspect, the lead pin can be reliably positioned by the support frame, and by extension, the case.

According to an exemplary aspect, positioning of the upper-side substrate is performed with the support body, and the positioning of the support body is performed by the support frame. Therefore, the adjacent placement of the positioning portion of the lead pin and the positioning portion of the support body leads to a highly precise and reliable lead pin position with respect to the upper-side substrate. Furthermore, excellent ease of assembly during manufacturing can also be achieved.

According to an exemplary aspect, providing the support frame in contact with the upper side of the lead frame reliably achieves positioning of the lead frame in the vertical direction. Moreover, using the support frame to press the lead frame toward the lower side during assembly ensures that an excellent positional relationship is maintained between the lead frame and the power semiconductor element connected therewith.

According to an exemplary aspect, the placement position of the support body can be freely set without consideration for its positional relationship with the lower-side substrate. As a consequence, the degree of freedom for selection of the placement position of the support body increases considerably. Hence, if a portion of the upper-side substrate is structured as a weight placement portion upon which a weight is placed, then the weight location support body is disposed on the lower area thereof near the vicinity of the weight placement portion on the lower side.

Using such a structure enables the weight location support body to achieve a structure in which more weight can be borne from the weight placement portion than with other support bodies. Also, the degree of freedom with respect to the structure of the drive control circuit can be increased considerably.

A typical example of this type of electronic circuit device is an inverter module, and a compact device with high reliability can be achieved in which heat from the power circuit is released well to the outside through the metal base plate.

What is claimed is:

1. An electronic circuit device, comprising:
   a lower-side substrate formed with a main circuit;
   an upper-side substrate formed with a drive control circuit that drivingly controls the main circuit;
   a support body positionally fixed by hardened resin above the lower-side substrate; and
   a case having a peripheral portion with an outer surface that has at least a portion of an external lead-out terminal of the drive control circuit and the main circuit thereon, and a substrate storage space that accommodates the lower-side substrate on a side inward from the peripheral portion, wherein:
   the lower-side substrate is accommodated inside the substrate storage space in an arrangement where the upper-side substrate is positioned over at least a portion of the lower-side substrate,
   a space over the lower-side substrate is filled with a filling material that is formed from a resin, and
   the upper-side substrate is supported and fixed by the support body.

2. The electronic circuit device according to claim 1, further comprising:
   a support frame integrated with the case that bridges across the substrate storage space between the lower-side substrate and the upper-side substrate, wherein:
   the support body is positionally fixed by the hardened resin through the support frame.

3. The electronic circuit device according to claim 2, wherein a plurality of the lower-side substrates is provided juxtaposed, and the support body is positioned over a space between different lower-side substrates.

4. The electronic circuit device according to claim 3, wherein a lead pin that extends from the lower-side substrate toward the upper-side substrate is positioned by the support frame.

5. The electronic circuit device according to claim 4, wherein a positioning portion in the support frame for the lead pin is provided adjacent to a positioning portion in the support frame for the support body.

6. The electronic circuit device according to claim 5, wherein the support frame contacts a lead frame that connects the external lead-out terminal and the main circuit formed on the lower-side substrate.

7. The electronic circuit device according to claim 6, wherein:
 a portion of the upper-side substrate is formed as a weight placement portion on which a weight is placed, and
 a weight location support body is provided that mainly supports the weight from the weight placement portion.

8. The electronic circuit device according to claim 7, wherein:
 the main circuit is a power circuit that is formed by mounting a power semiconductor element on an insulated substrate,
 the drive control circuit is a drive control circuit that mounts a circuit component on a print circuit board, and
 the lower-side substrate formed with the power circuit is mounted and positionally fixed on a metal base plate for heat radiation, and the case is positionally fixed by the metal base plate.

9. The electronic circuit device according to claim 2, wherein a lead pin that extends from the lower-side substrate toward the upper-side substrate is positioned by the support frame.

10. The electronic circuit device according to claim 9, wherein a positioning portion in the support frame for the lead pin is provided adjacent to a positioning portion in the support frame for the support body.

11. The electronic circuit device according to claim 10, wherein the support frame contacts a lead frame that connects the external lead-out terminal and the main circuit formed on the lower-side substrate.

12. The electronic circuit device according to claim 2, wherein the support frame contacts a lead frame that connects the external lead-out terminal and the main circuit formed on the lower-side substrate.

13. The electronic circuit device according to claim 1, wherein:
 the main circuit is a power circuit that is formed by mounting a power semiconductor element on an insulated substrate,
 the drive control circuit is a drive control circuit that mounts a circuit component on a print circuit board, and
 the lower-side substrate formed with the power circuit is mounted and positionally fixed on a metal base plate for heat radiation, and the case is positionally fixed by the metal base plate.

14. A manufacturing method for an electronic circuit device comprising a lower-side substrate formed with a main circuit; an upper-side substrate formed with a drive control circuit that drivingly controls the main circuit; and a case having a peripheral portion with an outer surface that has at least a portion of an external lead-out terminal of the drive control circuit and the main circuit thereon, and a substrate storage space that accommodates the lower-side substrate on a side inward from the peripheral portion, wherein the lower-side substrate is accommodated inside the substrate storage space in an arrangement where the upper-side substrate is positioned over at least a portion of the lower-side substrate, and at least a space over the lower-side substrate is filled with a filling material, the manufacturing method comprising the steps of:
 pouring a resin serving as the filling material between the lower-side substrate and a support body in a support body positioned state where the support body that supports the upper-side substrate is positioned over the lower-side substrate, which is positioned within the substrate storage space;
 hardening the poured resin and positionally fixing the support body over the lower-side substrate; and
 fixing the upper-side substrate on the positionally fixed support body.

15. The manufacturing method according to claim 14, wherein:
 a support frame bridging the substrate storage space is integrated with the case, and
 the support body positioned state is achieved by using the support body to position the support frame in a lower-side substrate storage state where the lower-side substrate is accommodated within the substrate storage space.

16. The manufacturing method according to claim 15, wherein
 the main circuit is a power circuit that is formed by mounting a power semiconductor element on an insulated substrate,
 the drive control circuit is a drive control circuit that mounts a circuit component on a print circuit board, and
 the lower-side substrate formed with the power circuit is mounted and positionally fixed on a metal base plate for heat radiation, and the case is positionally fixed by the metal base plate.

17. The manufacturing method according to claim 14, wherein:
 the main circuit is a power circuit that is formed by mounting a power semiconductor element on an insulated substrate,
 the drive control circuit is a drive control circuit that mounts a circuit component on a print circuit board, and
 the lower-side substrate formed with the power circuit is mounted and positionally fixed on a metal base plate for heat radiation, and the case is positionally fixed by the metal base plate.

18. The manufacturing method according to claim 15, wherein the support frame is provided contacting a lead frame that connects the external lead-out terminal and the main circuit formed on the lower-side substrate.

* * * * *

UNITED STATES PATENT AND TRADEMARK OFFICE
CERTIFICATE OF CORRECTION

| | | |
|---|---|---|
| PATENT NO. | : 7,663,886 B2 | Page 1 of 1 |
| APPLICATION NO. | : 12/003037 | |
| DATED | : February 16, 2010 | |
| INVENTOR(S) | : Kazuo Aoki et al. | |

It is certified that error appears in the above-identified patent and that said Letters Patent is hereby corrected as shown below:

On the title page insert the following:

--[30]  Foreign Application Priority Data

December 27, 2006   [JP]   Japan.................................2006-351622--

Signed and Sealed this

Eleventh Day of May, 2010

David J. Kappos
*Director of the United States Patent and Trademark Office*